(12) United States Patent
Tielrooij et al.

(10) Patent No.: US 11,444,218 B2
(45) Date of Patent: Sep. 13, 2022

(54) DEVICE FOR OPERATING WITH THZ AND/OR IR AND/OR MW RADIATION

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES); ASOCIACIÓN CENTRO DE INVESTIGACIÓN COOPERATIVA EN NANOCIENCIAS, CIC NANOGUNE, Donostia/San Sebastián (ES)

(72) Inventors: Klaas-Jan Tielrooij, Castelldefels (ES); Frank Koppens, Castelldefels (ES); Rainer Hillenbrand, Donostia/San Sebastián (ES); Marta Autore, Donostia/San Sebastián (ES)

(73) Assignees: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES); ASOCIACIÓN CENTRO DE INVESTIGACIÓN COOPERATIVA EN NANOCIENCIAS, CIC NANOGUNE, Donostia/San Sebastián (ES)

( * ) Notice: Subject to any disclaimer, the term of this patent is extended or adjusted under 35 U.S.C. 154(b) by 19 days.

(21) Appl. No.: 16/957,045

(22) PCT Filed: Dec. 24, 2018

(86) PCT No.: PCT/EP2018/086845

§ 371 (c)(1),
(2) Date: Jun. 22, 2020

(87) PCT Pub. No.: WO2019/122454

PCT Pub. Date: Jun. 27, 2019

(65) Prior Publication Data

US 2021/0376181 A1    Dec. 2, 2021

(30) Foreign Application Priority Data

Dec. 22, 2017 (EP) .................................... 17382895

(51) Int. Cl.
*H01L 31/113* (2006.01)
*H01L 31/02* (2006.01)
(Continued)

(52) U.S. Cl.
CPC ...... *H01L 31/113* (2013.01); *H01L 31/02002* (2013.01); *H01L 31/028* (2013.01); *H01L 31/09* (2013.01)

(58) Field of Classification Search
CPC ............. H01L 31/113; H01L 31/02002; H01L 31/028; H01L 31/09
See application file for complete search history.

(56) References Cited

U.S. PATENT DOCUMENTS 9,105,791 B1    8/2015 Dyer et al.
2011/0198499 A1 8/2011 Park et al.
(Continued)

FOREIGN PATENT DOCUMENTS

CN    106374006 A    2/2017
EP    3 503 206 A1    6/2019
(Continued)

OTHER PUBLICATIONS

International Search Report corresponding to International Application No. PCT/EP2018/086845 dated Apr. 4, 2019.
(Continued)

*Primary Examiner* — Hoang-Quan Ho
(74) *Attorney, Agent, or Firm* — Jenkins, Wilson, Taylor & Hunt, P.A.

(57) ABSTRACT

The present invention relates to a device for operating with THz and/or IR and/or MW radiation, comprising: —an
(Continued)

antenna having one or more antenna branches (A1; A1, A2) and adapted to operate in the THz and/or IR and/or MW frequency range; and —a structure made of at least one photoactive material defining a photo-active area (Ga) arranged to absorb light radiation impinging thereon. The focus area of the at least one antenna branch (A1; A1, A2) is dimensionally equal or smaller than the photo-active area (Ga).

20 Claims, 4 Drawing Sheets

(51) Int. Cl.
*H01L 31/028* (2006.01)
*H01L 31/09* (2006.01)

(56) References Cited

U.S. PATENT DOCUMENTS

2013/0193404 A1 8/2013 Koppens et al.
2016/0380121 A1 12/2016 Suzuki et al.

FOREIGN PATENT DOCUMENTS

WO WO 2010/139791 A1 12/2010
WO WO 2013/112608 A1 8/2013
WO WO 2016/140946 A1 9/2016

OTHER PUBLICATIONS

Mics et al., "Thermodynamic picture of ultrafast charge transport in graphene," Nature Communications, vol. 6, p. 7655 (2015).
Peng et al., "Self-aligned local electrolyte gating of 2D materials with nanoscale resolution", Arxiv 1610:07646 (2016).
Song et al., "Hot Carrier Transport and Photocurrent Response in Graphene," Nano Letters, vol. 11, pp. 4688-4692 (2011).
Takahashi et al., "Terahertz Radiation via Ultrafast Manipulation of Thermoelectric Conversion in Thermoelectric Thin Films", Adv. Opt. Mat. 2, pp. 428-434 (2014).
Tielrooij et al., "Hot-carrier photocurrent effects at graphene-metal interfaces", J. Phys.: Condens. Matter 27, p. 164207 (2015).
Vicarelli et al., "Graphene field-effect transistors as room-temperature terahertz detectors," Nature Materials, vol. 11 pp. 865-871 (2012).
Written Opinion of the International Searching Authority corresponding to International Application No. PCT/EP2018/086845 dated Mar. 28, 2019.
Xu et al., "Photo-thermoelectric effect at a graphene interface junction", Nano Letters, vol. 10, pp. 562-566 (2010).
Extended European Search Report and Opinion for EP 17382895 dated Jul. 20, 2018.

DEVICE FOR OPERATING WITH THZ AND/OR IR AND/OR MW RADIATION

The project leading to this invention has received funding from the European Union's Horizon 2020 research and innovation programme under grant agreement no 696656 Graphene Flagship.

FIELD OF THE INVENTION

The present invention generally relates to a device for operating with THz and/or IR and/or MW radiation, comprising an antenna and a structure defining a photo-active area, and that has a size and shape such that the response of the device is optimized; and the arrangement of the photo-active area and of the antenna being provided for optimizing the interaction between far-field light and the photo-active area.

The device of the present invention can be used for both the detection and the emission of THz and/or IR and/or MW radiation.

BACKGROUND OF THE INVENTION

Terahertz (THz) frequencies are an underused part of the electromagnetic spectrum that lies between the infrared and microwave bands. The unique features of this part of the spectrum could be useful for biological sensing and medical imaging, chemical identification and material characterization.

On the other hand, the importance of devices operating with infrared (IR) frequencies is clear for many applications, such as for implementing components in optical communications, thermal imaging and sensor networking.

Recent intense electrical and optical studies of graphene and other high Seebeck coefficient materials have pushed these materials to the forefront of optoelectronic research. Specifically, the unique optoelectronic properties of graphene make it an ideal platform for a variety of photonic applications, such as the graphene field-effect transistors as room-temperature terahertz detectors disclosed in [1].

THz or IR or MW (microwave) light that is incident on graphene creates hot electrons [2] that generate a photocurrent through the photo-thermoelectric (PTE) effect when graphene is combined with a means of generating a Seebeck gradient. There are various device geometries and methods that generate a Seebeck gradient, thus leading to PTE current generation, not limited to the following: i) split gates: typically two metal gates separated by a narrow gap, which are capacitively coupled to graphene, where the voltage applied to each metal gate determines the carrier density—and thus Seebeck coefficient—of the graphene section located above each metal gate [3], ii) adjacent regions of graphene with a different number of layers, e.g. monolayer and bilayer [4], iii) local electrolyte gating where one of the graphene sections is not in contact with the electrolyte, thus creating a Seebeck gradient [5], iv) a graphene-metal interface [6], and v) adjacent regions with different chemically and/or photo-chemically induced doping. In all these cases two graphene sections are created with a different Seebeck coefficient, leading to net PTE photocurrent generation when light is incident on the interface between the two graphene sections, where the Seebeck gradient is located. For example, in the case of split gates, the graphene sections have an independently tuneable Fermi energy, making it possible to create an optimized interface for PTE photocurrent generation, generally a pn-junction.

A photo-active device for operating with THz radiation, comprising the features of the preamble of claim 1 of the present invention is disclosed in Chinese patent document CN106374006A. Said patent document particularly discloses a THz detector, comprising, arranged over a substrate, a log-periodic optical antenna formed by two branches separated by an antenna gap, a graphene layer arranged within said antenna gap in physical contact with the substrate and with both antenna branches, a dielectric structure covering the graphene layer and the optical antenna, and a split-gate arranged over the graphene layer separated therefrom by part of the dielectric structure. Among other drawbacks, in the device proposed by CN106374006A, the channel is very wide (>>1 micrometer), which is disadvantageous for photo-thermoelectric detection. The reason for this is that the PTE photoresponse scales with the increase in electron temperature at the location of the Seebeck gradient, and for a given amount of incident light the increase in electron temperature is larger the smaller the region where this light is focused. Therefore it is advantageous to reduce the channel width and at the same time focus the light. Additionally, the antenna gap, and therefore the area where light is focussed by the antenna, is larger than the photoactive area (around the split gates), with the disadvantageous effect that only a small portion of the THz radiation is absorbed in the photo-active area. Therefore, a low efficiency, particularly a low photoresponse, is obtained with the device disclosed in CN106374006A.

On the other hand, although photo-thermoelectrically induced THz emission is shown in the state of the art [7], said emission was shown for a non-tuneable, non-optimizable configuration, and therefore has several drawbacks, which make it less efficient, both in terms of achievable emission coverage and in terms of control for the generation and emission of the THz or IR radiation.

WO2013/112608A1 and US2011/198499A1 respectively disclose a device for operating with THz and/or IR and/or MW radiation, which is not designed for a photoresponse based on the photo-thermoelectric effect, but for a photoresponse based on either a photovoltaic effect or a photoconductive effect, which implies that the photoactive area thereof is formed by the whole photoactive material, and that they don't have the above mentioned problem related to the devices based on the photo-thermoelectric effect. Similarly, U.S. Pat. No. 9,105,791B1 discloses a device which is not defined as being designed for a photoresponse based on the photo-thermoelectric effect, and which also has as photoactive area the whole photoactive material area.

Hence, the fact that those devices have and antenna with a focus area smaller than the photo-active area is not a selection made for optimizing their photoresponse, i.e. is not based on the dimensions of the photoactive area, but just a structural consequence of the fact that the antenna has to be placed on a substrate and therefore it must adapt its dimensions to the dimensions of the substrate. In other words, the structural nature of the substrate, and not the photoactive nature thereof, is what is taken into account for the selection of the antenna dimensions and thus for the focus area.

US20160380121A1 discloses a device which has as principle photoresponse mechanism the photovoltaic effect, where the whole photoactive material, in this case graphene, forms the photoactive area, as a consequence of the application of bias voltages on respective electrodes located at opposite ends of a graphene layer. Although that document mentions the photo-thermoelectric effect, that effect is not used as the principle photoresponse mechanism bust just to cancel or increase the photoresponse obtained by means of the photovoltaic effect. No antenna is mentioned in said document.

Moreover, said devices are active devices, which means that they always need for a source-drain bias, and also, for that disclosed by WO2013/112608A1, for the simultaneous presence of an optical light pump pulse.

It is, therefore, necessary to provide an alternative to the state of the art, which covers the gaps found therein, by providing a device for operating with THz and/or IR and/or MW radiation, which does not possess the above-mentioned drawbacks, dramatically increasing the efficiency thereof.

REFERENCES

[1] L. Vicarelli et al., "Graphene field-effect transistors as room-temperature terahertz detectors", Nature Materials 11, 865-871 (2012).
[2] Z. Mics et al., "Thermodynamic picture of ultrafast charge transport in graphene", Nature communications, 6, 7655 (2015).
[3] J. C. W. Song et al., "Hot Carrier Transport and Photocurrent Response in Graphene", Nano Letters, 11, 4688-4692 (2011).
[4] X. Xu et al., "Photo-thermoelectric effect at a graphene interface junction", Nano Letters, 10, 562-566 (2010).
[5] C. Peng et al. "Self-aligned local electrolyte gating of 2D materials with nanoscale resolution", Arxiv 1610:07646 (2016).
[6] K. J. Tielrooij et al. "Hot-carrier photocurrent effects at graphene-metal interfaces", J. Phys.: Condens. Matter 27, 164207 (2015)
[7] K. Takahashi et al., "Terahertz Radiation via Ultrafast Manipulation of Thermoelectric Conversion in Thermoelectric Thin Films", Adv. Opt. Mat. 2, 428-434 (2014)

SUMMARY OF THE INVENTION

To that end, the present invention relates to a device for operating with THz and/or IR and/or MW radiation, comprising:
an antenna having at least one antenna branch and adapted to operate in the THz and/or IR and/or MW frequency range; and
a structure made of at least one photoactive material defining a photo-active area arranged to absorb light radiation impinging thereon.

In contrast to the devices known in the state of the art, specifically in contrast to that disclosed by CN106374006, in the device of the present invention, said at least one antenna branch has a focus area which is dimensionally equal or, preferably, smaller than said photo-active area.

The photo-active area is the area for which absorbed light is converted into electrical signals, and is smaller than the total area occupied by the at least one photoactive material, specifically a portion thereof. This is a key difference with the devices of the prior art identified above which are based or mainly based on the photoconductive or photovoltaic effect.

For a preferred embodiment, the above mentioned structure is made of at least one photoactive material with high Seebeck coefficient and comprises two sections with different Seebeck coefficients, such that the photo-active area, within an active channel having a Seebeck gradient and arranged to absorb light radiation impinging thereon, is defined at the interface between said two sections and through adjacent regions thereof at both sides of the interface, and wherein said focus area is dimensionally equal or smaller, according to a first direction, than the dimension of the photo-active area measured in parallel to said first direction and transversally to said interface across said adjacent regions.

The present invention, as stated below, is preferably optimized for a photoresponse based on the photo-thermoelectric effect, where a photoresponse is generated through light-induced charge carrier heating, in combination with the presence of said Seebeck gradient.

For an embodiment, said dimension is being given by the cooling length $L_{cool}$ of hot carriers on both adjacent regions, i.e. $2L_{cool}$.

For an embodiment, the antenna only comprises one antenna branch that has an extremity occupying a volume which is located below or above part of the photoactive area, wherein said focus area is located at said antenna branch extremity.

For an alternative embodiment, the antenna has at least two antenna branches that are separated by a distance), measured along a separation direction, which is equal or smaller than the dimension of the above mentioned photo-active area measured along a direction that is parallel to said separation direction, such that the area where the THz and/or IR and/or MW field is confined is equal to or smaller than the photo-active area, in contrast to the geometry of the device disclosed by the above mentioned Chinese patent document, thus providing a much better photoresponse.

When the photo-active area is defined at the interface between the above mentioned two sections, said direction that is parallel to the separation direction is a direction transversal to the interface across the above mentioned adjacent regions For a preferred embodiment of the device of the present invention, an optimized design thereof is proposed, in order to obtain an optimized PTE response. The geometric considerations for said optimized design are discussed below.

As a crucial feature for that optimized design, it is here pointed out that for an optimized PTE response the photo-active area of the device should be small—on the order of a micrometer in both dimensions. The photoactive area is defined in one dimension by the width of the photoactive structure. The reason that a small width is advantageous is that this maximizes the average increase in electron temperature over the channel width and thus PTE photoresponse, while care should be taken not to compromise too much the increasing resistance for decreasing channel width. In the other dimension (the one defined above as measured transversally to the interface across the adjacent regions), as indicated above for a preferred embodiment, the photoactive area is defined by a distance on each side of the Seebeck gradient that corresponds to the cooling length $L_{cool}$, because in that other dimension what matters is the ability of hot carriers to reach the Seebeck gradient and therefore that's why is given by the hot carrier cooling length $L_{cool}$.

The ideal dimensions of the channel defined by the photo-active area are therefore in the micrometer range. Thus, one is faced with the challenge of matching the THz and IR and/or MW optical fields, with typical wavelengths much larger than 1 micrometer, to the photo-active area of the device with micrometer dimensions. In the case of THz and MW light, this requires compressing the optical field by four or more orders of magnitude to ensure optimal device operation. This is achieved by combining the optimized PTE device with an antenna, as mentioned above.

For some embodiments, the above mentioned interface is a pn-, np-, nn-, or pp-, junction, for example an electrostatically gating created junction, while the above mentioned two sections with different Seebeck coefficients, they can be created by different kind of means or mechanisms, such as chemical and/or photo-chemical induced doping.

However, for a preferred embodiment, said two sections are created by means of a split-gate comprised by the device of the present invention, wherein said split-gate comprises first and second gate sections separated by a gap and capacitively coupled to the above mentioned structure to create said two sections when a voltage differential is applied to the split-gate, wherein said focus area of the at least one antenna branch and/or the distance separating the at least two antenna branches is dimensionally equal or smaller than a separation distance defined by said gap separating the first and second gate sections and being measured along a direction that is parallel to the above mentioned first direction and/or the above mentioned separation direction.

For said embodiment related to the inclusion of a split-gates the two sections of the structure have an independently tuneable Fermi energy, making it possible to create an optimized interface for PTE photocurrent generation, such as a pn-junction.

For a preferred embodiment, for which the antenna comprises at least two antenna branches, the antenna and the split-gate are the same element, each of the above mentioned two branches being a respective of said first and second gate sections.

Therefore, the confined THz and/or IR and/or MW field overlaps with the region where the Seebeck gradient is largest, thus constituting an optimal arrangement for absorbing and/or emitting as much THz and/or IR radiation as possible in the photo-active area.

The antenna is made of a highly electrically conductive (at IR and/or THz and/or MW frequencies) material, such as gold or doped semiconductors, and, depending on the embodiment, is a dipole antenna (such as a half-wave dipole antenna), a bow-tie antenna, a log-periodic antenna, etc. When the antennas consist of at least two branches they can be also used simultaneously as antenna and split-gate.

For an embodiment, the device of the present invention further comprises a bottom dielectric layer and an active layer made of the photoactive material arranged on top of said bottom dielectric layer.

For another embodiment, the device further comprises a top dielectric layer, wherein the active layer is arranged between the top and the bottom dielectric layers.

According to a preferred embodiment, the above mentioned structure comprises an encapsulated graphene structure having, as said active layer, at least a graphene layer arranged between a top and a bottom dielectric layers, wherein said dielectric layers are preferably made of hBN (hexagonal Boron Nitride), although other dielectric materials are also embraced by the present inventions, for other embodiments, such as other two-dimensional layered materials (e.g. $MoS_2$, $WSe_2$, etc.), or typical dielectric materials such as $Al_2O_3$, $HfO_2$ etc.

For less preferred embodiments, one or more active layers of other types of high Seebeck coefficient photo-active materials, instead of graphene, are used to make said structure, such as, but not limited to: black phosphorus (see for instance L. Viti et al. Sci Rep 2016; 6:20474), $Bi_2Te_3$ or other topological insulators (TIs) (see for instance Hongliang Shi et al. Phys. Rev. Applied 3, 014004, 2015).

For an implementation of said preferred embodiment, and of similar embodiments not including graphene, the bottom dielectric layer is arranged over the antenna bridging a gap between the two antenna branches so that said interface between the two graphene sections is arranged over the antenna branches gap. In an alternative implementation, the antenna is arranged on top of the active layer with the high-Seebeck coefficient photo-active material, whether that material is graphene or another material.

For an embodiment, the device according to the present invention further comprises a first voltage source connected to the first gate section and a second voltage source connected to the second gate section, to generate and apply the above mentioned voltage differential to the split-gate.

According to a variant of said embodiment, the first voltage source generates and applies a voltage V1 to the first gate section, and the second voltage source generates and applies a voltage V2 to the second gate section, wherein V1 and V2 are voltages of substantially between −100 V and +100 V.

Generally, for the embodiment for which the antenna comprises at least two antenna branches, they are separated by a gap equal to or below the cooling length of photo-heated carriers (defining one dimension of the photo-active area), thus preferably below 5 μm, and even more preferably below 1 μm because such a small gap provides a stronger field confinement, and optimizes overlap with the region of highest Seebeck gradient/active area.

With respect to the above mentioned photo-active graphene layer that is optimized for a response, for some embodiments it has a width Wg from 10 nm up to 10 μm, preferably 0.1 μm up to 5 μm, and a length Lg from 10 nm up to 10 μm, preferably from 0.2 μm up to 5 μm, in any case equal or larger than the cooling length.

Regarding the dimensions of the antenna branch or of each of the antenna branches, according to some embodiments each of the antenna branches has a width Wa from 10 nm up to 1 mm, a length La from 100 nm to 1 mm, according to the desired resonant frequency (or frequency range), and a thickness Ta from 1 nm up to 50 μm.

For some embodiments, each of the top and bottom dielectric layers has a thickness from 0.5 nm up to 50 μm.

The device of the present invention has two main embodiments, a first one for which the device constitutes a THz and/or IR and/or MW radiation detector, and a second one for which the device constitutes a THz and/or IR and/or MW radiation emitter. The above described embodiments, and most of those which will be described below, are valid for both of the here referred as first and second main embodiments.

For the first main embodiment, the device according to the present invention constitutes a THz and/or IR and/or MW radiation detector, wherein the antenna is configured and arranged to focus and confine THz and/or IR and/or MW radiation in the focus area of the at least one antenna branch (between the antenna branches, for the embodiment for which there are two is between the antenna branches), to concentrate it at said photo-active area, which is arranged to absorb THz and/or IR and/or MW light radiation, and the device further comprises at least first and second electrical contacts electrically connected to distanced regions of the structure to measure photo-induced current flowing between the first and second electrical contacts, through the structure, when THz and/or IR and/or MW light radiation impinges on the photo-active area.

According to an implementation of said first main embodiment, the above mentioned regions of the structure to which the first and second electrical contacts are electrically connected are regions of the graphene layer (or of an active layer made of a material which is not graphene but that has a high Seebeck coefficient) arranged between a top and a bottom dielectric layer.

For the second main embodiment, the device according to the present invention constitutes a THz and/or IR and/or MW radiation emitter, wherein the photo-active area is arranged to absorb light radiation from femtosecond light pulses shined thereon, wherein the device further comprises a controlled light source adapted and arranged to generate and emit controlled femtosecond light pulses on the photo-active area, so that a photo-thermoelectrically induced local photovoltage is created in the structure by ultrafast charge separation in the photo-active area of the device, which leads to the generation of THz and/or IR and/or MW radiation, and wherein the antenna is configured and arranged to efficiently couple said generated THz and/or IR and/or MW radiation to far field regions around the device.

According to an implementation of the second main embodiment, the first and second voltage sources are adapted to generate and apply the above mentioned voltage differential to the split-gate to electrostatically control the generation and emission of the THz and/or IR and/or MW radiation.

The focus area is defined as that area where radiation is focused and confined, whether the THz and/or IR and/or MW radiation for those embodiments for which the device constitutes a THz and/or IR and/or MW radiation detector, or the light radiation in the form of femtosecond light pulses for those embodiments for which the device constitutes a THz and/or IR and/or MW radiation emitter.

A more specific definition of the term focus area as understood in the present invention would be as the area that contains more than 50% of the radiation transduced by the antenna. That definition covers all the embodiments described in the present document, including those for which the focus area is in between the two branches, as well as a hot spot at an extremity of a single antenna branch.

For a preferred embodiment, the device according to the present invention is configured and arranged to operate under zero bias voltage, which provides a minimal dark current (limited by Johnson noise) and lower power consumption.

The device of the present inventions can be applied in several application fields, such as security, sensing, medical imaging, data communication, research, chemical identification, material characterization, thermal imaging, sensor networking, etc.

The device of the present invention is principally optimized for a photoresponse based on the photo-thermoelectric effect, where a photoresponse is generated through light-induced carrier heating (i.e. an increase in the charge carrier temperature), in combination with the presence of a gradient in the Seebeck coefficient.

However, other embodiments of the device of the present invention are possible, for which the operation of the device is not restricted to the above mentioned mechanism, i.e. to the photoresponse based on the photo-thermoelectric effect, and thus includes, complementarily to said mechanism based on the photo-thermoelectric effect, at least another photoresponse mechanism not based on the photo-thermoelectric effect.

In particular, for said other embodiments the device of the present invention implements one or more of the following mechanisms: i) the photovoltaic effect, where photo-excited electron-hole pairs are separated by a built-in or externally applied (through a bias voltage) electric field; ii) the bolometric effect, where a light-induced change device temperature leads to a change in conductance and thus a change in observed current (requiring a bias voltage); iii) the photo-gating effect, where a light-induced change in carrier density in the photoactive layer leads to a change in conductance and thus a change in observed current (requiring a bias voltage); and iv) the plasma-wave-assisted mechanism, where rectification of incoming radiation (due to the nonlinear response of the charge carriers in the photoactive material) leads to a DC photoresponse, while (ideally) exploiting resonant interference of plasma waves in a cavity.

As an additional feature of the device of the present invention, included in some embodiments thereof, a mechanism is included therein that can enhance the photoresponse, and in particular the amount of power from the incident light that is transferred to the electron system, by exploiting graphene plasmons. The idea is that the concentrated electromagnetic field in the gap between the two gate sections leads to launching of graphene plasmons—charge density oscillations bound to the graphene sheet, having a wavelength typically two orders of magnitude smaller than that of the incident light. These plasmons can propagate along the graphene channel and reflect at the edge or the graphene-contact interface, and as such—in the case of long-lived plasmons—the graphene channel acts as a resonant cavity for the plasmons. Exploiting this cavity, by optimizing the length of the graphene channel (Lg), can lead to extremely efficient transfer of power from the incident light into the graphene charge carrier system, maximizing the photoresponse.

For a further embodiment, the device of the present invention is configured and arranged to operate (generally non-simultaneously), as a THz and/or IR and/or MW radiation detector according to any of the above described embodiments related to a detector, and as a THz and/or IR and/or MW radiation emitter according to any of the above described embodiments related to an emitter.

The operation as a radiation emitter or as a radiation detector is controlled at least on whether or not the femtosecond light pulses are applied, but could also depend on other parameters, such as, in case there was a split-gate, on the applied voltage differential. There could be one more further control parameters that could be relevant, such as the voltage between the two electrodes or electrical contacts that contact the photoactive layer, if so. By applying a voltage there, the amount of emitted light can be enhanced.

A further aspect of the present invention relates to an apparatus comprising the THz and/or IR and/or MW radiation detector of the present invention and a THz and/or IR and/or MW radiation emitter.

For an embodiment of the apparatus of the present invention, the THz and/or IR and/or MW radiation emitter is constituted by the device of present invention according to any of the above described embodiments related to an emitter.

For an alternative embodiment of the apparatus of the present invention, the THz and/or IR and/or MW radiation emitter is a laser source, preferably a THz quantum cascade laser (QCL), and the THz and/or IR and/or MW radiation detector is a THz radiation detector.

Regarding said alternative embodiment, preferably, the apparatus further comprises a cooler configured and arranged to cool both the QCL (particularly the stack of semiconductor multiple quantum well heterostructures) and the THz radiation detector, so that an improved sensitivity for the detector is achieved.

For an implementation of said alternative embodiment, the THz radiation detector is integrated into the QCL.

For an alternative implementation of said alternative embodiment, the THz radiation detector is not integrated into the QCL but just combined therewith.

The following are only some of the possible applications for which the apparatus of the present invention is useful: THz spectrometry, such as dual-comb spectrometry, THz time-of-flight (TOF) distance or thickness determination, frequency-domain and time-domain THz absorption/reflection determination, etc.

An additional aspect of the present invention relates to a device which differs from the one claimed only in that instead of being optimized for a photoresponse based on the photo-thermoelectric effect, where a photoresponse is generated through light-induced charge carrier heating, is optimized for another kind of photo-thermal effect for which also a photoresponse is generated through light-induced charge carrier heating.

In other words, an additional aspect of the present invention relates to a device for operating with THz and/or IR and/or MW radiation, comprising:
an antenna having at least one antenna branch and adapted to operate in the THz and/or IR and/or MW frequency range; and
a structure made of at least one photoactive material defining a photo-active area arranged to absorb light radiation impinging thereon;
wherein said at least one antenna branch has a focus area which is dimensionally equal or smaller than said photo-active area,
wherein said structure is made of a photoactive material with high Seebeck coefficient and comprises two sections with different Seebeck coefficients, such that said photo-active area, within an active channel having a Seebeck gradient and arranged to absorb light radiation impinging thereon, is defined at the interface between said two sections and through adjacent regions thereof at both sides of the interface, and wherein said focus area is dimensionally equal or smaller, according to a first direction, than the dimension of the photo-active area measured in parallel to said first direction and transversally to said interface across said adjacent regions,
and wherein the device is optimized for a photoresponse based on the photo-thermal effect, where a photoresponse is generated through light-induced charge carrier heating, in combination with the presence of said Seebeck gradient.

For a preferred embodiment of said additional aspect of the present invention, said photothermal effect is a photo-thermomagnetic effect.

All the embodiments described in the present document for the device optimized for a photoresponse based on the photo-thermoelectric effect (and also for the apparatus comprising such a device) are also valid for the device of the additional aspect of the present invention described above, including the above mentioned preferred embodiment for which the device is optimized for a photoresponse based on the photo-thermomagnetic effect, and also embodiments for which the device is optimized for a photoresponse based on another kind of photo-thermal effect, or on a combination of two or more photo-thermal effects (such as a combination of a photo-thermomagnetic effect and a photo-thermoelectric effect).

BRIEF DESCRIPTION OF THE FIGURES

In the following some preferred embodiments of the invention will be described with reference to the enclosed figures. They are provided only for illustration purposes without however limiting the scope of the invention.

DETAILED DESCRIPTION OF SEVERAL EMBODIMENTS

Figure 3:
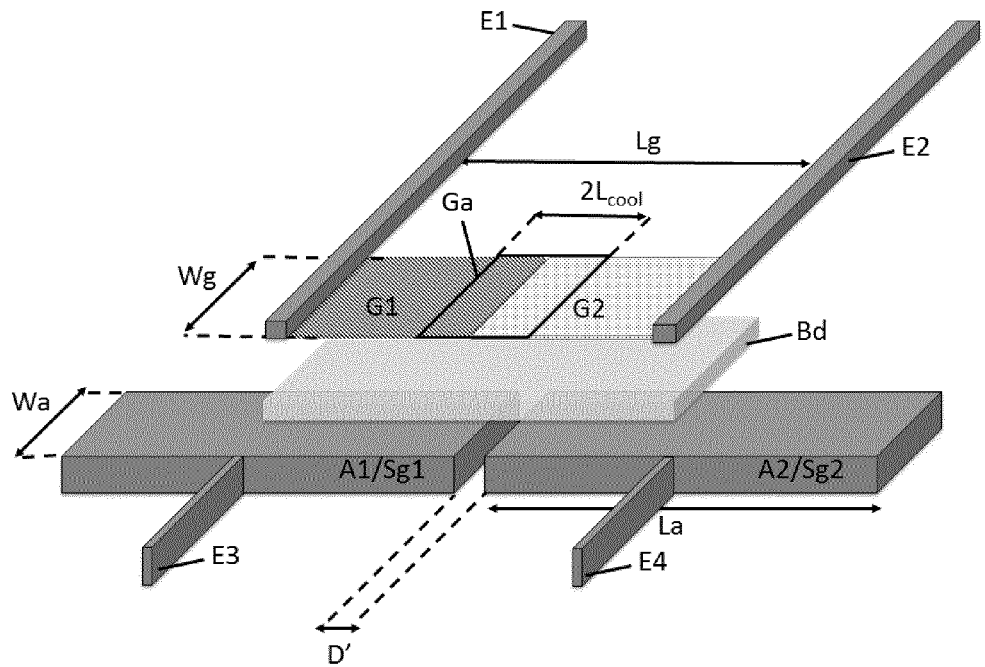
FIG. 3 is a schematic perspective view of another embodiment of the device of the present invention, highlighting some crucial dimensions thereof.

As depicted in the attached drawings, the device of the present invention comprises, for the illustrated embodiments:
an antenna having two antenna branches A1 and A2, and adapted to operate as an antenna in the THz and/or IR and/or MW frequency range;
a structure, made of a photoactive material with high Seebeck coefficient, such as graphene arranged on top of a bottom dielectric layer Bd (for example made of hBN), wherein said structure comprises two sections G1, G2 with different Seebeck coefficients, such that a photo-active area Ga (identified in FIG. 3, represented schematically by a solid-line rectangle), within an active channel having a Seebeck gradient and arranged to absorb light radiation impinging thereon, is defined at the interface between the two sections G1, G2 and through adjacent regions thereof at both sides of the interface, particularly along the cooling length $L_{cool}$ at each side of the interface, and with a width Wg (as shown in FIG. 3) defined by the width of the photo-active channel defined by the structure.

For the embodiment shown in FIG. 3, the device of the present invention only includes one dielectric layer, particularly bottom dielectric layer Bd, while for the embodiments of FIGS. 1-4 and 7 the device also includes a top dielectric layer Td arranged on top of the photoactive material with high Seebeck coefficient (such as graphene).

Although the photo-active area Ga is only represented in FIG. 3, the embodiments of FIGS. 1 to 3 and 5 also include such a photo-active area Ga with the same dimensions (Wg and $2L_{cool}$). Therefore, for all of said embodiments (as shown in FIG. 3), the two antenna branches A1, A2 are separated by a distance D' which is smaller (although it could be equal) than the dimension of the photo-active area Ga measured transversally to said interface across said adjacent regions, i.e. smaller than $2L_{cool}$. Therefore, the focus area of the antenna is also smaller than $2L_{cool}$.

For the illustrated embodiments, the device of the present invention also comprises a split gate having two gate segments/sections Sg1 and Sg2, adapted to create the above mentioned two regions G1, G2 in the photoactive structure, with the aim of generating a Seebeck gradient in between said two regions G1, G2. As stated in a previous section of this document, alternatively, other kind of mechanisms could be used for creating regions G1, G2, instead of the mentioned split gate.

The first Sg1 and second Sg2 gate sections of the split gate are separated by a gap D and capacitively coupled to said structure to create, when a voltage differential is applied to the split-gate, the two sections G1, G2 with independently tuneable Fermi energy therein when a voltage differential is applied to the split-gate, wherein the width of the photo-active channel Wg and the cooling length $L_{cool}$ define the photo-active area Ga, wherein the distance D' separating the at two antenna branches A1, A2 is equal or smaller than a separation distance defined by said gap D separating the first Sg1 and second Sg2 gate sections.

Figure 1:
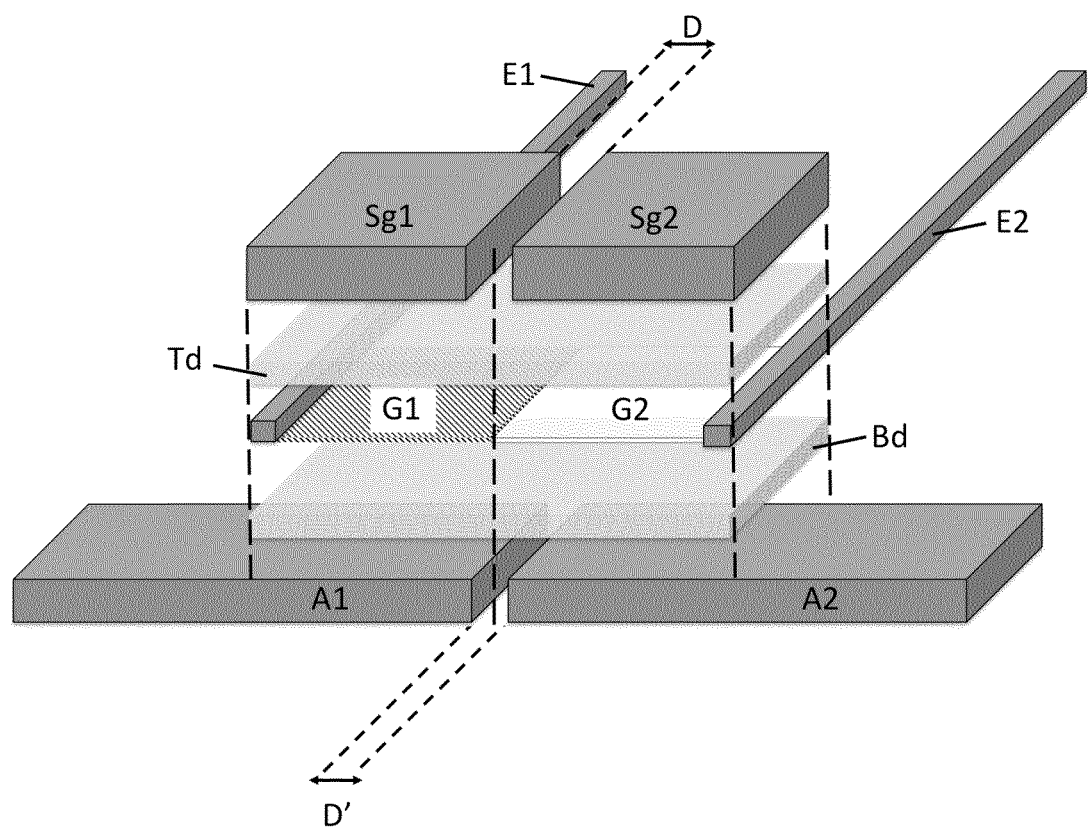
FIG. 1 is a schematic perspective view of one embodiment of the device of the present invention, where the antenna branches and gate segments are separate elements.
Figure 2:
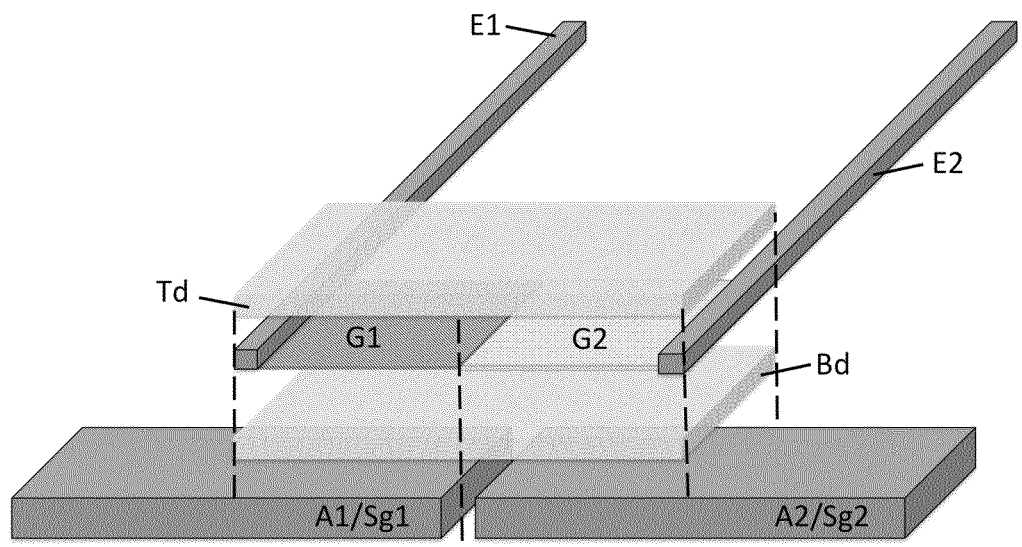
FIG. 2 is a schematic perspective view of another embodiment of the device of the present invention, where the antenna branches and gate segments are the same elements.

For the embodiment of FIG. 1, the antenna branches A1, A2 and gate segments Sg1, Sg2 are separate elements, and as shown therein D'<D, while for the embodiments of FIGS. 2 to 5, they are the same elements, so D'=D.

As shown especially in FIGS. 1 to 5, the bottom dielectric layer Bd is arranged over the antenna bridging gap D' so that the interface between the two sections G1, G2 is arranged over gap D', i.e. over the focus area of the antenna.

Although not shown in the drawings, the device of the present invention comprises a first voltage source connected to the gate section Sg1 and a second voltage source connected to the gate section Sg2, to generate and apply the above mentioned voltage differential to the split-gate.

The following different dimensions (some of which are indicated in FIG. 3) refer to respective embodiments of the device of the present invention, including those shown in FIGS. 1-5 and 7, with values included in those ranges already indicated in a previous section, and which for a working prototype are the ones indicated below:

Wg: Width of photo-active channel (i.e. of photo-active area Ga), with a value from 0.1 µm up to 5 µm.

Wa: Width of each antenna branch/gate section A1/Sg1, A2/Sg2, with a value of 2 µm.

Lg: Length of the photo-active structure formed by sections G1 and G2, with a value from 0.2 µm up to 5 µm, always larger than 2*cooling length.

La: Length of each antenna branch/gate section A1/Sg1, A2/Sg2, from a few microns up to a few hundred microns.

Ta: Thickness of each antenna branch/gate section A1/Sg1, A2/Sg2, with a value of 30 nm.

h1 (only for the embodiments of FIGS. 1, 2, 4, 5, and 7): Thickness of the top dielectric layer Td, with a value between 0.5 nm and 50 µm.

h2: Thickness of the bottom dielectric layer Bd, with a value between 0.5 nm and 50 µm.

Lc: Length of each of the electrical contacts E1-E2, with a value just enough to allow access thereto. For example, a value of 10 µm is appropriate for to wirebonding to them, although for other kind of connection, a value of just 2 µm would do.

$W_c$: Width of electrical contacts E1-E4, with a value of 200 nm.

hc: thickness of the electrical contacts E1-E4, with a value of 30 nm.

Although not shown in the attached Figures, note that a substrate is generally included in the device of the present invention to support the rest of elements arranged there on or there under.

Electrical contacts E1 and E2 are not necessary for the embodiments for which the device constitutes a THz and/or IR and/or MW radiation emitter, but only for implementing a THz and/or IR and/or MW detector, while electrical contacts E3 and E4 (see FIG. 3) are not essential for any embodiment, but only included in case a wirebonding to the antenna branches/gate sections A1/Sg1, A2/Sg2 is required.

Figure 4:
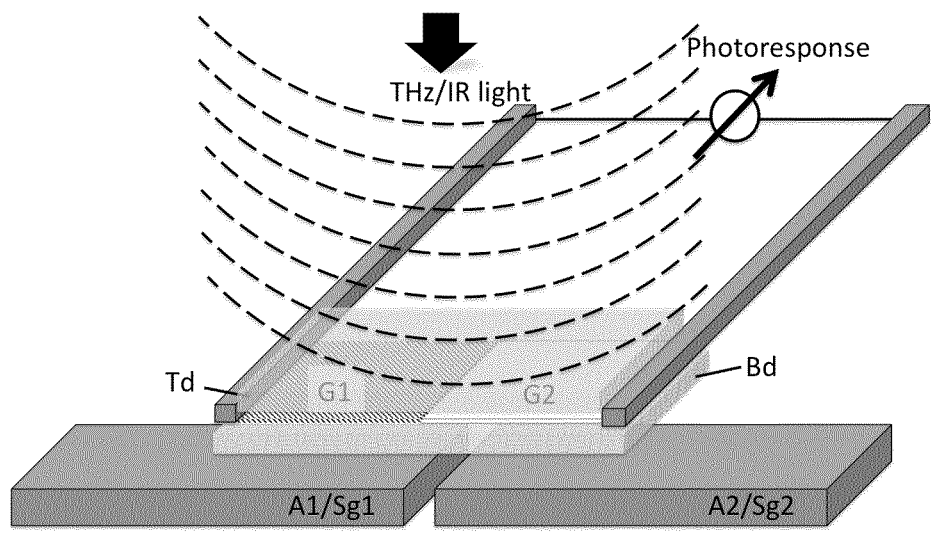
FIG. 4 is a perspective view, also schematic, which shows the device of the present invention, for an embodiment for which the device constitutes a THz and/or IR radiation detector.
Figure 5:
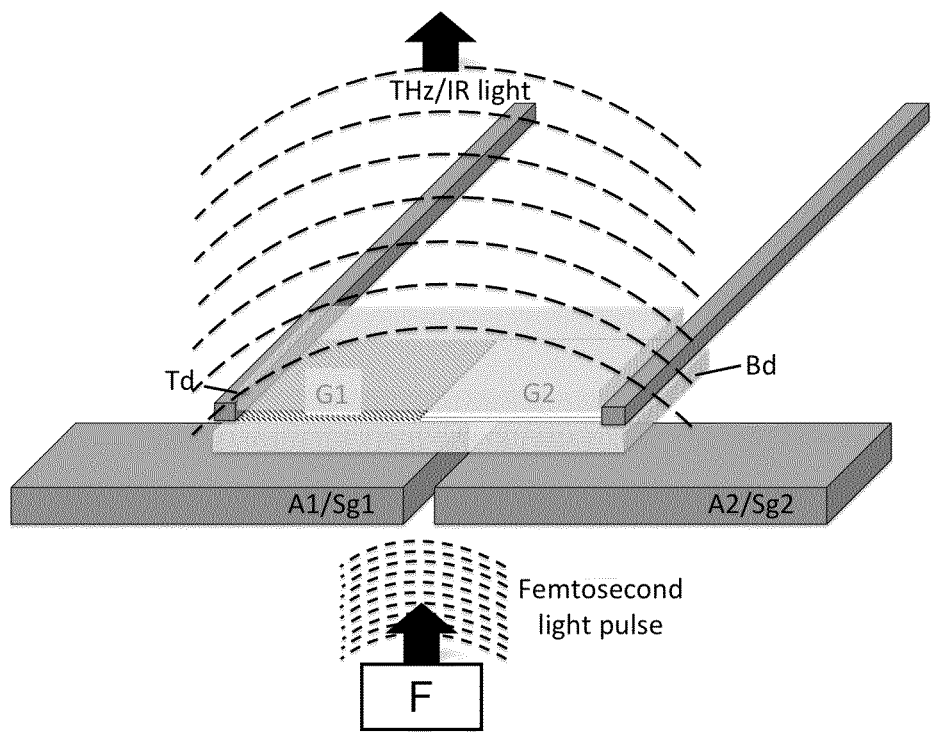
FIG. 5 is another schematic perspective view, which shows the device of the present invention, for an embodiment for which the device constitutes a THz emitter.

As already stated in a previous section, the device of the present invention can be used as a THz and/or IR and/or MW detector, as shown in FIG. 4, and as a THz and/or IR and/or MW emitter, as shown in FIG. 5. For both of the embodiments illustrated in FIGS. 4 and 5, the device can be operated under zero bias voltage, which provides a minimal dark current (limited by Johnson noise) and lower power consumption, although it can also be operated with an applied bias voltage.

Specifically, for the embodiment of FIG. 4, the device of the present invention constitutes a THz and/or IR and/or MW radiation detector, wherein the antenna is configured and arranged to focus and confine THz and/or IR and/or MW radiation in between the two antenna branches A1, A2 (i.e., in the focus area), to concentrate it at the photo-active area Ga, which is arranged to absorb THz and/or IR and/or MW light radiation, and the device further comprises first E1 and second E2 electrical contacts electrically connected to distanced regions of the graphene layer G to measure photo-induced current flowing between the first E1 and second E2 electrical contacts (i.e. by means of a photoresponse measuring element as depicted in FIG. 4), through the photo-active layer, when THz and/or IR and/or MW light radiation impinges on the photo-active area.

The operation details for a working prototype of the embodiment of FIG. 4 is described below.

A voltage V1 is applied to gate segment Sg1, and a voltage V2 to gate segment Sg2, where V1 and V2 are voltages on the order of 1 V. The voltage differential creates the above mentioned Seebeck gradient in the photo-active channel defining the photo-active area Ga, for example a pn-junction if the photo-active material is encapsulated graphene directly above the split-gate interface, with a distance corresponding to the cooling length on both sides of the interface defining one dimension of the photo-active area where the photoresponse is generated, the other dimension being the width of the photo-active channel. For optimal device operation, incident THz and/or IR and/or MW light needs to overlap with the photo-active area Ga of the photodetector. That's exactly what the antenna of the device of the present invention does: it focuses the THz and/or IR and/or MW light in between the two antenna branches A1 and A2.

Figure 6:
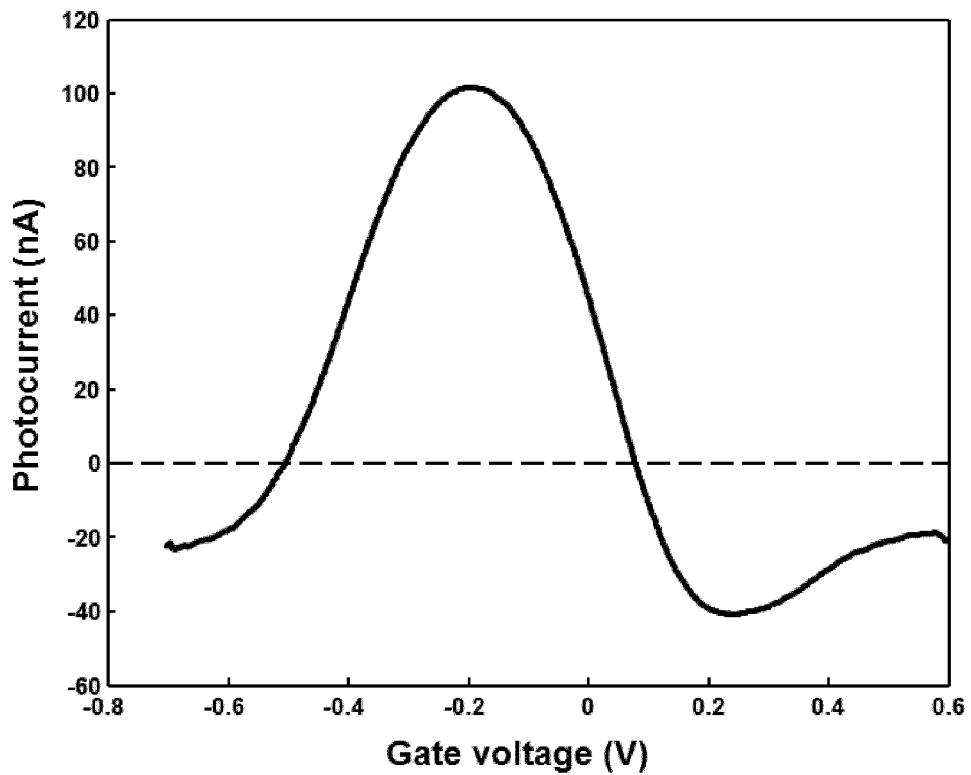
FIG. 6 shows experimental results with the photoresponse of a working prototype: photocurrent as a function of gate voltage.

FIG. 6 shows experimental results with the photoresponse of said working prototype, particularly in the form of photocurrent as a function of gate voltage.

From measurement made with the above described working prototype, it has been checked that the detector is relatively broadband (defined by the antenna) and can reach a Noise-equivalent power (NEP) of ~160 pW/Hz$^{1/2}$ and a Detectivity (D*) of ~0.6 10^8 Jones, together with a response time of a few picoseconds. Also, there is no need for cooling the detector and the material and fabrication processes are cheap.

For the embodiment of FIG. 5, the device of the present invention constitutes a THz and/or IR and/or MW radiation emitter, wherein the photo-active area Ga is arranged to absorb light radiation from femtosecond light pulses shined thereon with a controlled light source F of the device, which is adapted and arranged to generate and emit controlled femtosecond light radiation, so that a photothermoelectrically induced local photovoltage is created at the graphene structure by ultrafast charge separation which leads to the generation of THz and/or IR and/or MW radiation, and wherein the antenna is configured and arranged to emit said generated THz and/or IR and/or MW radiation to far field regions around the device.

First and second voltage sources (not shown) are respectively connected to the antenna branch/gate section A1/Sg1 and the antenna branch/gate section A2/Sg2, and adapted to generate and apply a voltage differential to the split-gate to electrostatically control the generation and emission of said THz and/or IR and/or MW radiation.

The operation details for a working prototype of the embodiment of FIG. 5 is described more specifically below.

A voltage V1 is applied to A1/Sg1, and a voltage V2 to A2/Sg2, where V1 and V2 are voltages on the order of 1 V. The voltage differential creates the above mentioned Seebeck gradient, for example a pn-junction, in the structure including sections G1, G2, (formed, for example, by encapsulated graphene) directly above the split-gate interface, with the photo-active area Ga where the photoresponse is generated defined in one dimension by the cooling length of hot carriers on both sides of the Seebeck gradient (2×Lcool) and in the other dimension by the width of the photo-active channel Wg. As explained above, Femtosecond light pulses (of basically any wavelength) are shined on the photo-active area Ga, and the antenna will emit THz and/or IR and/or MW radiation due to ultrafast generation of a PTE (photo-thermoelectric) photovoltage. In contrast to other known emitters of the state of the art [5], the device of the present invention includes an antenna for better out-coupling if the light and provides an electrostatic control of the generation and emission of the THz and/or IR and/or MW radiation through the voltages applied on the split-gate.

It must be noted that, for non-illustrated embodiments, the antenna of the device of the present invention is different to the one depicted in FIGS. 1-5, both regarding the type of antenna, which could be spiral antennas, a bowtie antennas (triangles), patch antennas, etc., and also regarding their dimensions.

As stated in a previous section, non-illustrated embodiments similar to the ones described with reference to the attached drawings, but for which other kind of photo-active areas not including two sections with different Seebeck coefficients are included, are also covered by the present invention.

Figure 7:
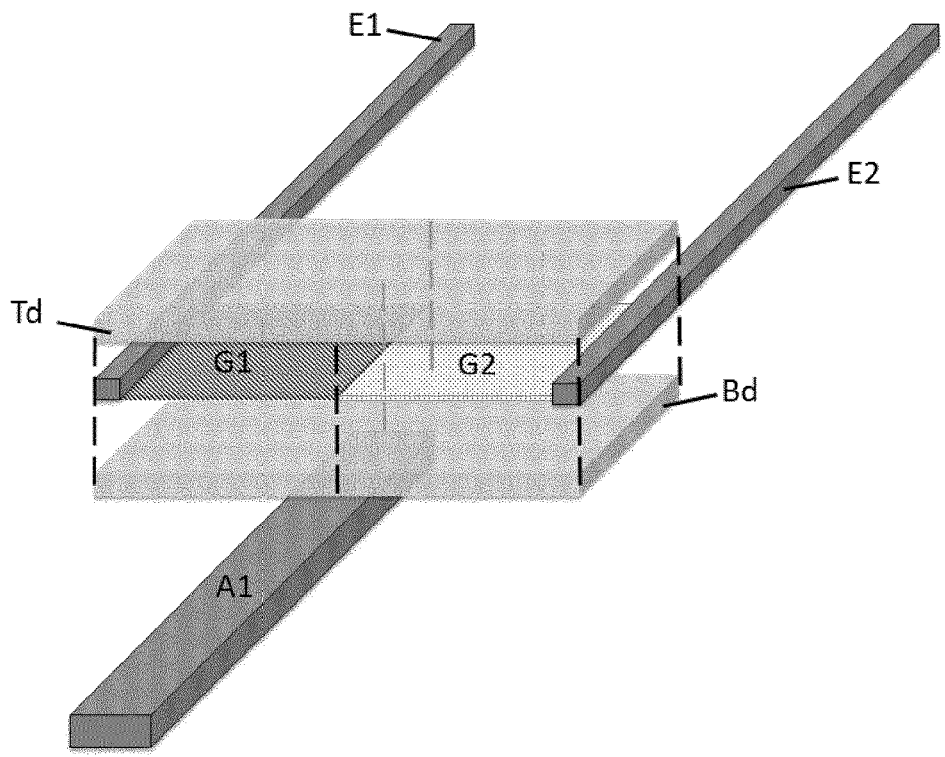
FIG. 7 shows a schematic perspective view, of one embodiment of the present invention, where the antenna consists of a single branch.

Finally, FIG. 7 shows a schematic perspective view of a further embodiment of the device of the present invention, where the antenna consists of a single branch A1 that has a focus area which is dimensionally equal or smaller than the photo-active area Ga. Said focus area is located at the extremity of the antenna branch A1 that occupies a volume which is located below (or above, for a non-illustrated embodiment) part of the photoactive area Ga (which, although not identified in FIG. 7, is defined and dimensioned as that of FIG. 3).

Figure 8A:
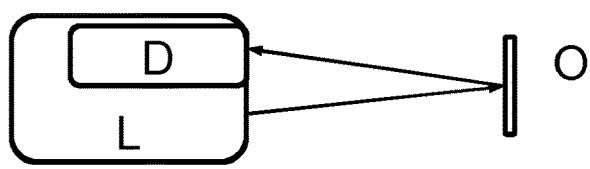
FIGS. 8a and 8b show two respective embodiments of the apparatus of the present invention, for which the apparatus comprises a laser source L, preferably a THz QCL, and the THz and/or IR and/or MW radiation detector is a THz radiation detector D.
Figure 8B:
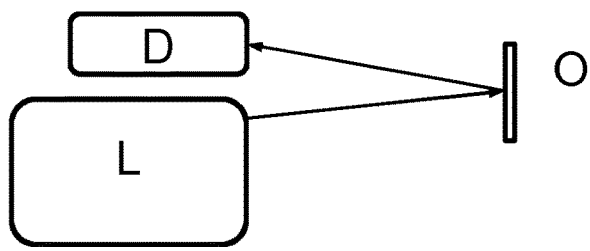

FIGS. 8*a* and 8*b* show two respective embodiments of the apparatus of the present invention, for which the apparatus comprises a laser source L, preferably a THz QCL, and the THz and/or IR and/or MW radiation detector is a THz radiation detector D.

For the embodiment of FIG. 8*a* the THz detector D is integrated into the QCL, i.e. within the same box, where the THz detector is preferably positioned close to the cooling unit that is present in the QCL, i.e. close to the QCL stack.

However, for the embodiment of FIG. 8*b* the THz detector D is not integrated into the QCL but just combined therewith, i.e. placed in a separate box, but part of the same equipment.

For both embodiments, an arrangement for a TOF application is shown, in order to measure a distance to an object O.

A person skilled in the art could introduce changes and modifications in the embodiments described without departing from the scope of the invention as it is defined in the attached claims.

The invention claimed is:

1. A device for operating with at least one of THz, IR, and MW radiation, comprising:
    an antenna having at least one antenna branch and adapted to operate in at least one of a THz, IR, and MW frequency range; and
    a structure made of at least one photoactive material defining a photo-active area arranged to absorb light radiation impinging thereon;
    wherein said at least one antenna branch has a focus area which is dimensionally equal or smaller than said photo-active area,
    wherein said at least one photoactive material of said structure has a high Seebeck coefficient and comprises two sections with different Seebeck coefficients, such that said photo-active area, within an active channel having a Seebeck gradient and arranged to absorb light radiation impinging thereon, is defined at an interface between said two sections and through adjacent regions thereof at both sides of the interface, and wherein said focus area is dimensionally equal or smaller, according to a first direction, than the dimension of the photo-active area measured in parallel to said first direction and transversally to said interface across said adjacent regions,
    and wherein the device is optimized for a photoresponse based on a photo-thermal effect, where a photoresponse is generated through light-induced charge carrier heating, in combination with the presence of said Seebeck gradient.

2. The device according to claim 1, wherein said photo-thermal effect is a photo-thermoelectric effect.

3. The device according to claim 2, wherein said dimension of the photo-active area measured in parallel to said first direction and transversally to said interface across said adjacent regions is $2L_{cool}$, where $L_{cool}$ is the cooling length of hot carriers on both adjacent regions.

4. The device according to claim 2, wherein another dimension of the photo-active area is defined by a width of the structure made of the at least one photoactive material.

5. The device according to claim 2, wherein said antenna has at least two antenna branches that are separated by a distance, measured along a separation direction, which is equal or smaller than the dimension of said photo-active area measured along a direction that is parallel to said separation direction.

6. The device according to claim 2, further comprising a split-gate comprising first and second gate sections separated by a gap and capacitively coupled to said structure to create said two sections when a voltage differential is applied to the split-gate, wherein at least one of said focus area of the at least one antenna branch and said distance separating said at least two antenna branches is dimensionally equal or smaller than a separation distance defined by said gap separating the first and second gate sections and being measured along a direction that is parallel to at least one of said first direction and said separation direction.

7. The device according to claim 6, wherein said antenna has at least two antenna branches that are separated by a distance, measured along a separation direction, which is equal or smaller than the dimension of said photo-active area measured along a direction that is parallel to said separation direction, and wherein said antenna and said split-gate are the same element, each of said at least two antenna branches being a respective of said first and second gate sections.

8. The device according to claim 2, further comprising a bottom dielectric layer and an active layer made of said at least one photoactive material arranged on top of said bottom dielectric layer.

9. The device according to claim 8, further comprising a top dielectric layer, wherein said active layer is arranged between said top and said bottom dielectric layers.

10. The device according to claim 9, wherein said structure comprises an encapsulated graphene structure having, as said active layer, at least a graphene layer arranged between said top and said bottom dielectric layers.

11. The device according to claim 10, further comprising a mechanism for enhancing the photoresponse of the device, by exploiting graphene plasmons of the graphene layer.

12. The device according to claim 8, wherein said antenna has at least two antenna branches that are separated by a distance, measured along a separation direction, which is equal or smaller than the dimension of said photo-active area measured along a direction that is parallel to said separation direction, and wherein said bottom dielectric layer is arranged over the antenna bridging a gap between the two antenna branches so that said interface between the two sections of the structure is arranged over said antenna branches gap.

13. The device according to claim 2, further comprising one or more active layers made of at least one of the following photoactive materials: graphene, black phosphorus, $Bi_2Te_3$, $Bi_2Te_2Se$, or $(Bi,Sb)_2(Te,Se)_3$.

14. The device according to claim 2, constituting a detector of said at least one of THz, IR, and MW radiation, wherein the antenna is configured and arranged to focus and confine said at least one of THz, IR, and MW radiation in the focus area of the at least one antenna branch, to concentrate said at least one of THz, IR, and MW radiation at said photo-active area, which is arranged to absorb said at least one of THz, IR, and MW radiation, and the device further comprises at least first and second electrical contacts electrically connected to distanced regions of the structure to measure photo-induced current flowing between said first and second electrical contacts, through the structure, when said at least one of THz, IR, and MW radiation impinges on the photo-active area.

15. The device according to claim 2, constituting an emitter of said at least one of THz, IR, and MW radiation, wherein said photo-active area is arranged to absorb light radiation from femtosecond light pulses shined thereon, wherein the device further comprises a controlled light source adapted and arranged to generate and emit controlled femtosecond light pulses on said photo-active area, so that a photothermoelectrically induced local photovoltage is created at the structure by ultrafast charge separation which leads to the generation of said at least one of THz, IR, and MW radiation, and wherein the antenna is configured and arranged to emit said generated at least one THz, IR, and MW radiation to far field regions around the device.

16. The device according to claim 15, further comprising:
a split-gate comprising first and second gate sections separated by a gap and capacitively coupled to said structure to create said two sections when a voltage differential is applied to the split-gate, wherein at least one of said focus area of the at least one antenna branch and said distance separating said at least two antenna branches is dimensionally equal or smaller than a separation distance defined by said gap separating the first and second gate sections and being measured along a direction that is parallel to at least one of said first direction and said separation direction; and
a first voltage source connected to the first gate section and a second voltage source connected to the second gate section, to generate and apply said voltage differential to the split-gate;
wherein the first and second voltage sources are adapted to generate and apply said voltage differential to the split-gate to electrostatically control the generation and emission of said at least one THz, IR, and MW radiation.

17. The device according to claim 2, wherein the device is configured and arranged to operate:
as a detector of said at least one of THz, IR, and MW radiation, wherein the antenna is configured and arranged to focus and confine said at least one of THz, IR, and MW radiation in the focus area of the at least one antenna branch, to concentrate said confine said at least one of THz, IR, and MW radiation at said photo-active area, which is arranged to absorb said at least one of THz, IR, and MW radiation, and the device further comprises at least first and second electrical contacts electrically connected to distanced regions of the structure to measure photo-induced current flowing between said first and second electrical contacts, through the structure, when said at least one of THz, IR, and MW radiation impinges on the photo-active area, and
as an emitter of said at least one of THz, IR, and MW radiation, wherein said photo-active area is arranged to absorb light radiation from femtosecond light pulses shined thereon, wherein the device further comprises a controlled light source adapted and arranged to generate and emit controlled femtosecond light pulses on said photo-active area, so that a photothermoelectrically induced local photovoltage is created at the structure by ultrafast charge separation which leads to the generation of said at least one of THz, IR, and MW radiation, and wherein the antenna is configured and arranged to emit said generated at least one THz, IR, and MW radiation to far field regions around the device.

18. The device according to claim 1, wherein said photothermal effect is a photo-thermomagnetic effect.

19. An apparatus, comprising:
a detector of at least one of THz, IR, and MW radiation, comprising:
an antenna having at least one antenna branch and adapted to operate in at least one of a THz, IR, and MW frequency range; and
a structure made of at least one photoactive material defining a photo-active area arranged to absorb light radiation impinging thereon;
wherein said at least one antenna branch has a focus area which is dimensionally equal or smaller than said photo-active area,
wherein said at least one photoactive material of said structure has a high Seebeck coefficient and comprises two sections with different Seebeck coefficients, such that said photo-active area, within an active channel having a Seebeck gradient and arranged to absorb light radiation impinging thereon, is defined at an interface between said two sections and through adjacent regions thereof at both sides of the interface, and wherein said focus area is dimensionally equal or smaller, according to a first direction, than the dimension of the photo-active area measured in parallel to said first direction and transversally to said interface across said adjacent regions, wherein the detector is optimized for a photoresponse based on a photo-thermal effect, where a photoresponse is generated through light-induced charge carrier heating, in combination with the presence of said Seebeck gradient;

and wherein the antenna is configured and arranged to focus and confine said at least one of THz, IR, and MW radiation in the focus area of the at least one antenna branch, to concentrate said at least one of THz, IR, and MW radiation at said photo-active area, which is arranged to absorb said at least one of THz, IR, and MW radiation, and the detector further comprises at least first and second electrical contacts electrically connected to distanced regions of the structure to measure photo-induced current flowing between said first and second electrical contacts, through the structure, when said at least one of THz, IR, and MW radiation impinges on the photo-active area; and an emitter of at least one of THz, IR, and MW radiation.

20. The apparatus according to claim 19, wherein said emitter is constituted by one of:

a device comprising:
   an antenna having at least one antenna branch and adapted to operate in at least one of a THz, IR, and MW frequency range; and a structure made of at least one photoactive material defining a photo-active area arranged to absorb light radiation impinging thereon;

wherein said at least one antenna branch has a focus area which is dimensionally equal or smaller than said photo-active area, wherein said at least one photoactive material of said structure has a high Seebeck coefficient and comprises two sections with different Seebeck coefficients, such that said photo-active area, within an active channel having a Seebeck gradient and arranged to absorb light radiation impinging thereon, is defined at an interface between said two sections and through adjacent regions thereof at both sides of the interface, and wherein said focus area is dimensionally equal or smaller, according to a first direction, than the dimension of the photo-active area measured in parallel to said first direction and transversally to said interface across said adjacent regions, wherein the device is optimized for a photoresponse based on a photo-thermal effect, where a photoresponse is generated through light-induced charge carrier heating, in combination with the presence of said Seebeck gradient;

and a THz laser source, in which case the detector is a THz radiation detector.

* * * * *